US010534667B2

(12) United States Patent
Olds et al.

(10) Patent No.: US 10,534,667 B2
(45) Date of Patent: Jan. 14, 2020

(54) SEGMENTED CLOUD STORAGE

(71) Applicant: Vivint, Inc., Provo, UT (US)

(72) Inventors: J. T. Olds, Salt Lake City, UT (US); Alen Peacock, Orem, UT (US); Andrew Harding, American Fork, UT (US); Jeff Wendling, West Jordan, UT (US)

(73) Assignee: Vivint, Inc., Provo, UT (US)

( * ) Notice: Subject to any disclaimer, the term of this patent is extended or adjusted under 35 U.S.C. 154(b) by 0 days.

(21) Appl. No.: 15/339,228

(22) Filed: Oct. 31, 2016

(65) Prior Publication Data

US 2018/0121285 A1    May 3, 2018

(51) Int. Cl.
| | | |
|---|---|---|
| *G06F 11/00* | (2006.01) | |
| *G06F 11/10* | (2006.01) | |
| *G06F 3/06* | (2006.01) | |
| *H03M 13/15* | (2006.01) | |

(52) U.S. Cl.
CPC .......... *G06F 11/1076* (2013.01); *G06F 3/064* (2013.01); *G06F 3/067* (2013.01); *G06F 3/0613* (2013.01); *H03M 13/1515* (2013.01)

(58) Field of Classification Search
CPC .... G06F 11/1076; G06F 3/0619; G06F 3/064; G06F 3/067; G06F 11/3006; H03M 13/1515
USPC ........................................ 714/763, 764, 784
See application file for complete search history.

(56) References Cited

U.S. PATENT DOCUMENTS

| | | | | |
|---|---|---|---|---|
| 2006/0174323 | A1* | 8/2006 | Brown ................ | H04L 63/0428 726/3 |
| 2008/0208909 | A1* | 8/2008 | Rowley ................ | H04L 41/069 |
| 2011/0110568 | A1* | 5/2011 | Vesper ................ | G06F 19/321 382/128 |
| 2011/0153351 | A1* | 6/2011 | Vesper ................ | G06Q 10/10 705/2 |
| 2011/0161802 | A1* | 6/2011 | Jia ........................ | G06F 17/24 715/235 |
| 2011/0225451 | A1* | 9/2011 | Leggette ............ | G06F 12/1425 714/6.22 |
| 2013/0097170 | A1* | 4/2013 | Flanagan ............. | G06F 3/0611 707/737 |

(Continued)

OTHER PUBLICATIONS

International Search Report and Written Opinion from PCT/US2017/59364 dated Jan. 26, 2018.

*Primary Examiner* — Albert Decady
*Assistant Examiner* — Osman M Alshack
(74) *Attorney, Agent, or Firm* — Workman Nydegger

(57) ABSTRACT

A computer system for optimizing bandwidth usage within a cloud storage system receives a request, through an application program interface (API), to store a digital file. The computer system then encodes the digital file into a set of multiple distinct blocks of data. The system also transmits the set of multiple distinct blocks of data to multiple remote storage nodes. The multiple distinct blocks of data are divided among at least a portion of the remote storage nodes. The system generates a log that comprises identification information associated with the digital file and an address for each respective block of data within each respective remote storage node. The system then transmits the log to a remote directory server. The directory server comprises multiple different logs that map multiple different digital files to the remote storage nodes.

9 Claims, 5 Drawing Sheets

(56) References Cited

U.S. PATENT DOCUMENTS

| | | | |
|---|---|---|---|
| 2013/0204849 A1* | 8/2013 | Chacko | G06F 3/0604 707/692 |
| 2013/0246568 A1* | 9/2013 | Chesterfield | H04L 67/1097 709/217 |
| 2013/0346795 A1* | 12/2013 | Gladwin | G06F 12/1458 714/6.22 |
| 2014/0006465 A1* | 1/2014 | Davis | G06F 16/182 707/827 |
| 2014/0068224 A1* | 3/2014 | Fan | G06F 3/0613 711/206 |
| 2015/0039645 A1* | 2/2015 | Lewis | G06F 16/9014 707/769 |
| 2015/0220284 A1 | 8/2015 | Wright | |
| 2015/0378827 A1 | 12/2015 | Grube et al. | |

* cited by examiner

SEGMENTED CLOUD STORAGE

BACKGROUND

Computers and computing systems have affected nearly every aspect of modern living. Computers are generally involved in work, recreation, healthcare, transportation, entertainment, household management, etc.

Computing system functionality can be enhanced by a computing systems ability to be interconnected to other computing systems via network connections. Network connections may include, but are not limited to, connections via wired or wireless Ethernet, cellular connections, or even computer-to-computer connections through serial, parallel, USB, or other connections. The connections allow a computing system to access services at other computing systems and to quickly and efficiently receive application data from other computing systems.

Interconnection of computing systems has facilitated distributed computing systems, such as so-called "cloud" computing systems. In this description, "cloud computing" may be systems or resources for enabling ubiquitous, convenient, on-demand network access to a shared pool of configurable computing resources (e.g., networks, servers, storage, applications, services, etc.) that can be provisioned and released with reduced management effort or service provider interaction. A cloud model can be composed of various characteristics (e.g., on-demand self-service, broad network access, resource pooling, rapid elasticity, measured service, etc.), service models (e.g., Software as a Service ("SaaS"), Platform as a Service ("PaaS"), Infrastructure as a Service ("IaaS"), and deployment models (e.g., private cloud, community cloud, public cloud, hybrid cloud, etc.).

Cloud and remote based service applications are prevalent. Such applications are hosted on public and private remote systems such as clouds and usually offer a set of web based services for communicating back and forth with clients.

Many computers are intended to be used by direct user interaction with the computer. As such, computers have input hardware and software user interfaces to facilitate user interaction. For example, a modern general-purpose computer may include a keyboard, mouse, touchpad, camera, etc. for allowing a user to input data into the computer. In addition, various software user interfaces may be available.

Examples of software user interfaces include graphical user interfaces, text command line based user interfaces, function key or hot key user interfaces, and the like.

In recent years, the use of cloud storage has gained significant popularity due to its ease of use, pervasive access, and security. For example, files stored within the cloud are often available to users through their computers, smart phones, or through any generic web browser. Additionally, files stored within the cloud are often stored within professional quality server farms that utilize various methods of data protection and redundancy, including, but not limited to, RAID configurations, data verification, advanced filesystems, and other similar technologies.

While cloud storage has provided significant benefits to end users, it comes at a high cost in bandwidth and hardware to the cloud providers. Cloud providers are conventionally required to purchase and continually update expensive storage arrays—that must also be redundant. Similarly, cloud providers are conventionally required to purchase and maintain large amounts of bandwidth so that users can quickly download large files that may be stored within their cloud accounts. As such, there is significant interest in addressing the technical challenges relating to efficient cloud storage.

The subject matter claimed herein is not limited to embodiments that solve any disadvantages or that operate only in environments such as those described above. Rather, this background is only provided to illustrate one exemplary technology area where some embodiments described herein may be practiced.

BRIEF SUMMARY

Embodiments disclosed herein include a computer system for optimizing bandwidth usage within a cloud storage system. The system comprises executable instructions that when executed by the one or more processors configure the computer system to receive a request, through an application program interface (API), to store a digital file. The computer system loads the digital file into local memory space. The computer system then encodes the digital file into a set of multiple distinct blocks of data. The multiple distinct blocks of data each comprise a retrievable portion of the digital file and parity information. The system also transmits the set of multiple distinct blocks of data to multiple remote storage nodes. The multiple distinct blocks of data are divided among at least a portion of the remote storage nodes. The system generates a log that comprises identification information associated with the digital file and an address for each respective block of data within each respect remote storage node. The system then transmits the log to a remote directory server. The directory server comprises multiple different logs that map multiple different digital files to the remote storage nodes.

Additional or alternative disclosed embodiments include a computer system for optimizing bandwidth usage within a cloud storage system. The computer system receives a request, through an application program interface (API), to access a digital file. The system queries a remote directory server for the digital file. The system then receives, from the remote server, addresses to data blocks stored within multiple remote storage nodes. Additionally, the system requests, from at least a portion of the remote storage nodes, at least a portion of the addressed data blocks. The system then decodes the digital file from the portion of the addressed data blocks. Decoding the digital file comprises rebuilding at least a portion of the digital file using parity information associated with the portion of the addressed data blocks. The system then communicates the decoded digital file to a requester.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the invention may be realized and obtained by means of the instruments and combinations particularly pointed out in the appended claims. Features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features can be obtained, a more particular description of the subject matter briefly described above will be rendered by reference to specific embodiments which are illustrated in the appended drawings. Understanding that these drawings depict only typical embodiments and are not therefore to be considered to be limiting in scope, embodiments will be described and explained with additional specificity and detail through the use of the accompanying drawings in which.

DETAILED DESCRIPTION

The following discussion now refers to a number of methods and method acts that may be performed. Although the method acts may be discussed in a certain order or illustrated in a flow chart as occurring in a particular order, no particular ordering is required unless specifically stated, or required because an act is dependent on another act being completed prior to the act being performed.

Embodiments disclosed herein provide methods and systems for optimizing bandwidth usage within a cloud storage system. In particular, disclosed embodiments perform data striping to store files between a large number of remote storage nodes. In at least one embodiment, the remote storage nodes comprise home-based computing devices that are each disposed within different respective houses. Additionally, in at least one embodiment the data is stored using error-correction coding such that when one or more remote storage nodes are unavailable and the data is recoverable.

Accordingly, disclosed embodiments optimize bandwidth usage within a cloud storage system by distributing discrete portions of a digital file among different remote storage nodes. As such, disclosed embodiments overcome bandwidth difficulties that are associated with having a single storage location for all data. In particular, the single storage location creates a bottleneck at that storage location for accessing the data. Additionally, storing the data at a single geographic location increases the likelihood of the data being inaccessible due to a power outage or natural disaster at the storage location.

Figure 1:
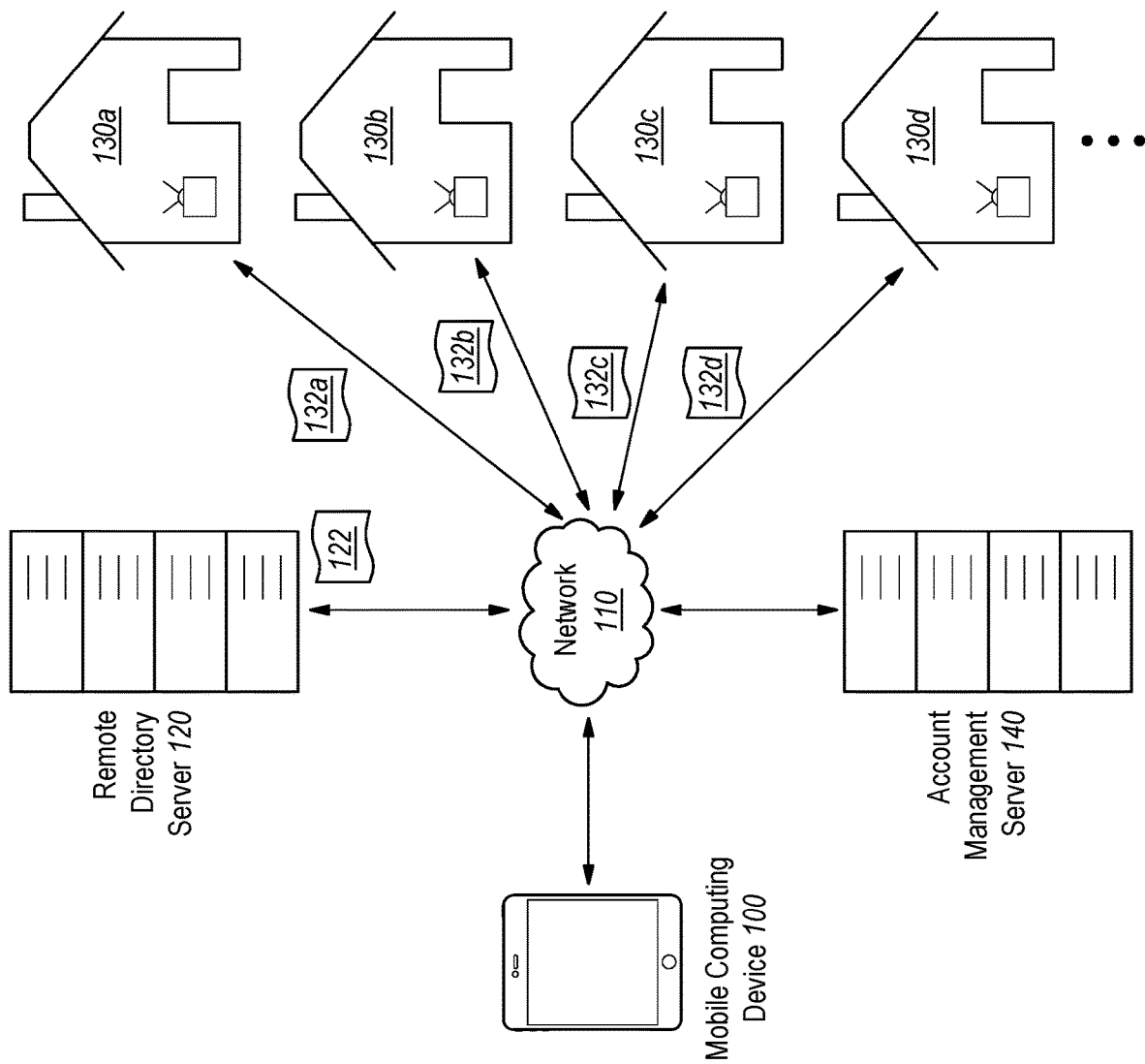
FIG. 1 illustrates a schematic of an embodiment of a system for optimizing bandwidth usage within a cloud storage system.
Figure 2:
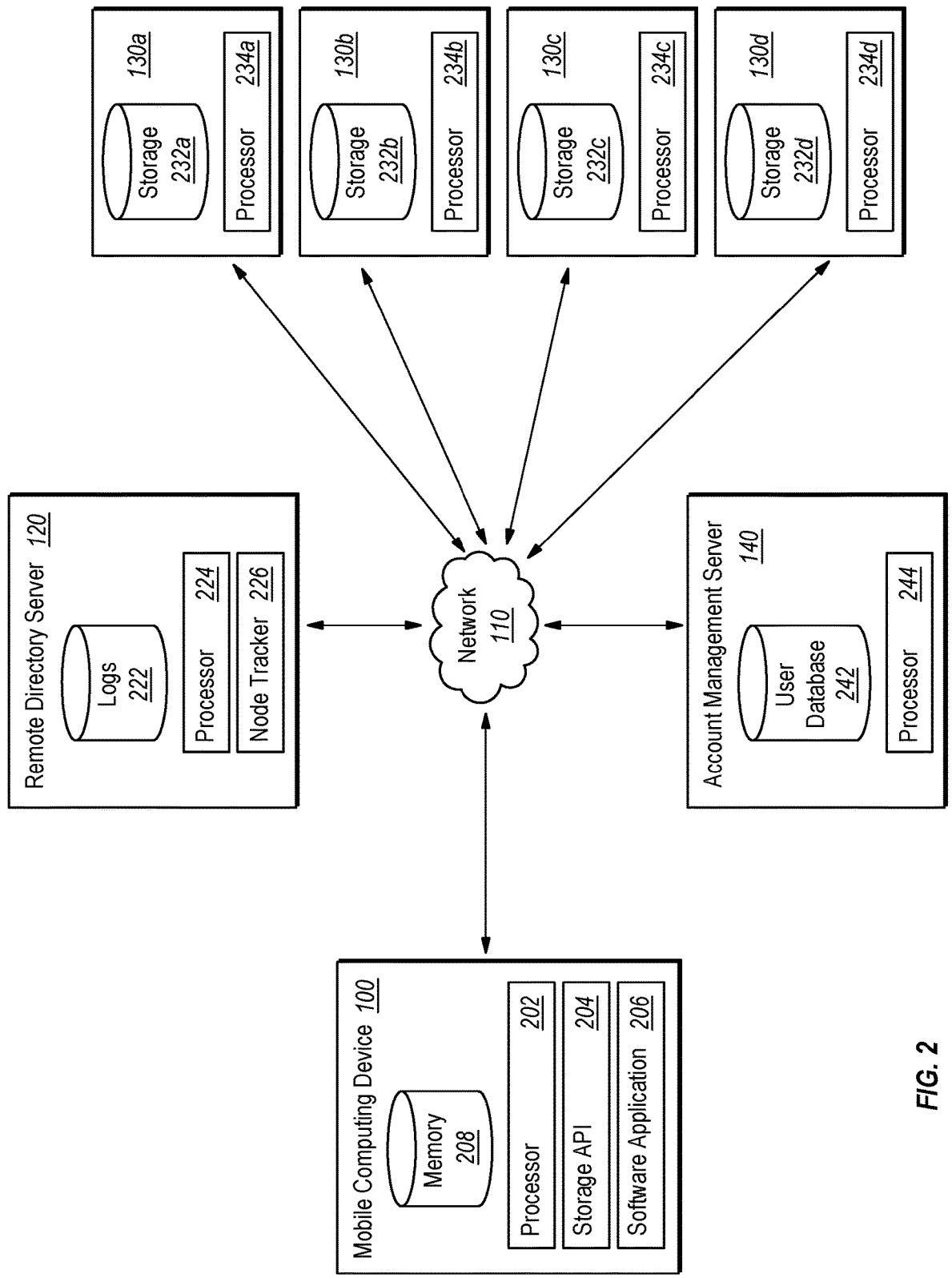
FIG. 2 illustrates a schematic of another embodiment of a system for optimizing bandwidth usage within a cloud storage system.

Turning now to the figures, FIGS. 1 and 2 illustrate schematics of an embodiment of a system for optimizing bandwidth usage within a cloud storage system. FIG. 1 depicts a hardware-based schematic that illustrates different hardware components within the system, while FIG. 2 illustrates a module-based schematic that illustrates modules within hardware components. In particular, a mobile computing device 100 communicates, through a network connection 110, with a remote directory server 120, an account management server 140, and various remote storage nodes 130(*a-d*).

One will understand that the depicted components of FIGS. 1 and 2 are provided for the sake of example and clarity. In various additional or alternative embodiments, different configurations and combinations of components are used. For example, the mobile computing device 100 can comprise a smart phone, a tablet computer, a laptop computer, a desktop computer, an embedded device, or any other device capable of processing digital information and communicating over a network. Similarly, the account management server 140 and the remote directory server 120 may be combined within a single server or distributed between multiple distinct servers.

Additionally, as used herein, a remote storage node comprises individual nodes within a distributed storage system. For example, the remote storage nodes may comprise individual computing units within different respective houses. In particular, the remote storage nodes may comprise a home server or home-based embedded device. For instance, in at least one embodiment, the remote storage nodes comprise home-based media storage devices that are configured to store the home owner's multimedia collection. As such, embodiments disclosed herein are configured to utilize excess space within home-based computing systems by forming a distributed cloud that leverages multiple remote storage nodes.

In at least one embodiment, the mobile computing device 100 comprises a computer system for optimizing bandwidth usage within a cloud storage system. In particular, the mobile computing device 100 comprises one or more processors and one or more computer-readable media having stored thereon executable instructions that when executed by the one or more processors configure the computer system to perform various acts. The acts include receiving a request, through an application program interface 204, to store a digital file.

In at least one embodiment, the request is generated by a software application 206 that is executed on the mobile computing device 100. For example, the mobile computing device 100 may execute a photo editing software application 206 that stores photos within the cloud. To initialize the storage of the photo, the photo editing software application 206 communicates the file to a storage API 204.

Upon receiving the file, or an address to the file, the processor 202 accesses the file within memory 208 and encodes the digital file into a set of multiple distinct blocks of data. The multiple distinct blocks of data each comprise a retrievable portion of the digital file, and the set of multiple distinct blocks of data comprises parity information (e.g., error-correction coding). In at least one embodiment, the processor 202 encodes the data using a Reed-Solomon algorithm. Additionally, in at least one additional or alternative embodiment, before encoding the data file, the processor 202 encrypts the digital file and stores the associated encryption key locally. Encrypting the file can protect the user's data while the data is stored in the cloud.

In at least one additional or alternative embodiment, the processor 202 communicates an authentication credential to an account management server 140. Upon receiving the authentication credential, a processor 244 within the account management server 140 accesses a user database 242 and validates the user's authentication credential. If the user's authentication credential is valid, the processor 244 transmits to the mobile computing device 100 a credential necessary for storing data within the cloud. In particular, in at least one embodiment, after being authenticated at the account management server 140, the processor 202 receives a credential necessary for accessing the remote directory server 120. In an additional or alternative embodiment, the processor 202 receives a credential necessary for accessing one or more of the remote storage nodes 130(a-d). Accordingly, in at least one embodiment, the ability to store data within the cloud is controlled by an account management server 140.

The processor 202 then transmits the set of multiple distinct blocks 132(a-d) of data to multiple remote storage nodes 130(a-d). Specifically, the multiple distinct blocks 132(a-d) of data are divided among at least a portion of the remote storage nodes 130(a-d). In at least one embodiment, the mobile computing device 100 stores, within memory 208, a list of available remote storage nodes 130(a-d). In an additional or alternative embodiment, before transmitting the set of multiple distinct blocks of data 132(a-d) to multiple remote storage nodes 130(a-d), the processor 202 requests from the remote directory server 120 a set of remote storage nodes 130(a-d) available for storage and internet protocol addresses 122 associated with each available remote storage node. Accordingly, there are various different means through which the processor 202 can identify available remote storage nodes 130(a-d).

The remote directory server 120 utilizes a node tracker component 226 in communication with a processor 224 to identify nodes that are currently available. In particular, the processor 224 causes the node tracker component 226 to periodically poll each remote storage node 130(a-d) to determine which nodes are available. As used herein, a remote storage node (e.g., 130a) is available when it is connected to the network 110 and comprises sufficient available storage space to store the file. Additionally, in at least one embodiment, a remote storage node 130a is available when the remote directory server determines that the user who is requesting to store the file has permissions to access the particular remote storage node 130a. For example, as will be explained more fully herein, in at least one embodiment, multiple different users can utilize the same cloud storage service. In such a case, it may be desirable to physically isolate users' data.

In at least one embodiment, the processor 202 also generates a log that comprises identification information associated with the digital file and an address for each respective block of data within each respective remote storage node. For example, the log may comprise a file name associated with the digital file and an IP address for each remote storage node 130(a-d) that was used to store blocks of data associated with the digital file. Additionally, the log may comprise an address for the location of the respective data blocks within each of the remote storage nodes 130(a-d).

The processor 202 transmits the log to the remote directory server 120. In at least one embodiment, the remote directory server 120 comprises multiple different logs 222 that map multiple different digital files to the remote storage nodes. Using the logs 222, one or more users can identify a desired file and request the file from the associated remote storage nodes 130(a-d).

For example, in at least one embodiment, a computer system, such as the mobile computing device 100, for optimizing bandwidth usage within a cloud storage system receives a request, through an application program interface (API), to access a digital file. The request may be generated by a software application 206, such as a photo editing software application 206, to access a photo stored within the cloud. In particular, the photo editing software application 206 may generate a request for the digital file through the storage API 204.

In response to receiving the query through the storage API 204, the processor 202 queries a remote directory server 120 for the digital file. The remote directory server 120 identifies within its logs 222 addresses to data blocks associated with the requested file that are stored within multiple remote storage nodes. In at least one embodiment, the remote directory server 120 then utilizes a node tracker component 226 to identify which of the respective remote storage nodes are currently available.

In at least one embodiment, an available remote storage node 130(a) comprises a storage node with up-to-date content. For example, the node tracker 226 within the remote directory server 120 can track the current version of data across the remote storage nodes 130(a-d). For instance, a digital file within the cloud may be updated during a time when one or more remote storage nodes 130(a-d) are not available. As such, the unavailable remote storage nodes 130(a-d) may not comprise the most recently updated version of the file. In such a case, the remote directory server 120 excludes data blocks associated with outdated versions and only returns addresses to remote storage nodes 130(a-d) that have the most up-to-date versions of the file.

Further, in at least one embodiment, when a processor 202 is not able to update all of the remote storage nodes 130(a-d) with the most recent changes to a file, the processor 202 saves the updated data blocks associated with the unavailable remote storage nodes within memory 208. The processor 202 then periodically polls the previously unavailable remote storage nodes to determine if they are now available. As each remote storage node becomes available, the processor 202 retrieves the respective data blocks from memory 208 and transmits them to the appropriate remote storage node (e.g., 130a).

In contrast to the above, in at least one embodiment, when a processor 202 is not able to update all of the remote storage nodes 130(a-d) with the most recent changes to a file, the processor 202 transmits the updated data blocks associated with the unavailable remote storage nodes 130(a-d) to the remote directory server 120, or some other associated server. The node tracker 226 then polls the previously unavailable remote storage nodes and updates them as they become available.

Upon identifying available remote storage nodes, the remote directory server 120 sends to the processor 202 addresses to data blocks stored within multiple available remote storage nodes. The addresses comprise at least IP addresses for accessing the remote storage nodes.

The processor 202 then requests, from at least a portion of the remote storage nodes 130(a-d), at least a portion of the addressed data blocks. In at least one embodiment, the processor 202 receives addresses to only available remote storage nodes 130(a-d).

Upon receiving the data blocks from the remote storage nodes 130(a-d), the processor decodes the digital file from the portion of the addressed data blocks. In at least one embodiment, decoding the digital file comprises rebuilding at least a portion of the digital file using parity information associated with the portion of the addressed data blocks. For example, one or more remote storage nodes that contain data blocks associated with the digital file may be unavailable. In such a circumstance, the processor 202 utilizes error-correction coding algorithms along with parity information in the received data blocks to rebuild the missing data. In at least one embodiment, the processor 202 utilizes a Reed-Solomon algorithm to rebuild the missing data. After rebuilding the file, the processor 202 communicates the decoded digital file to a requester—in this case the photo editing software application 206.

Additionally, in at least one embodiment, the processor 202 also decrypts the data within the data blocks. In particular, the processor 202 accesses a decryption key that is provided by a user or stored within memory 208 and decrypts the received data. As stated above, encrypting and decrypting the data using a key stored or received locally at the mobile computing device 100 adds additional security to the cloud storage by preventing other users from accessing the data stored in the cloud.

Figure 3:
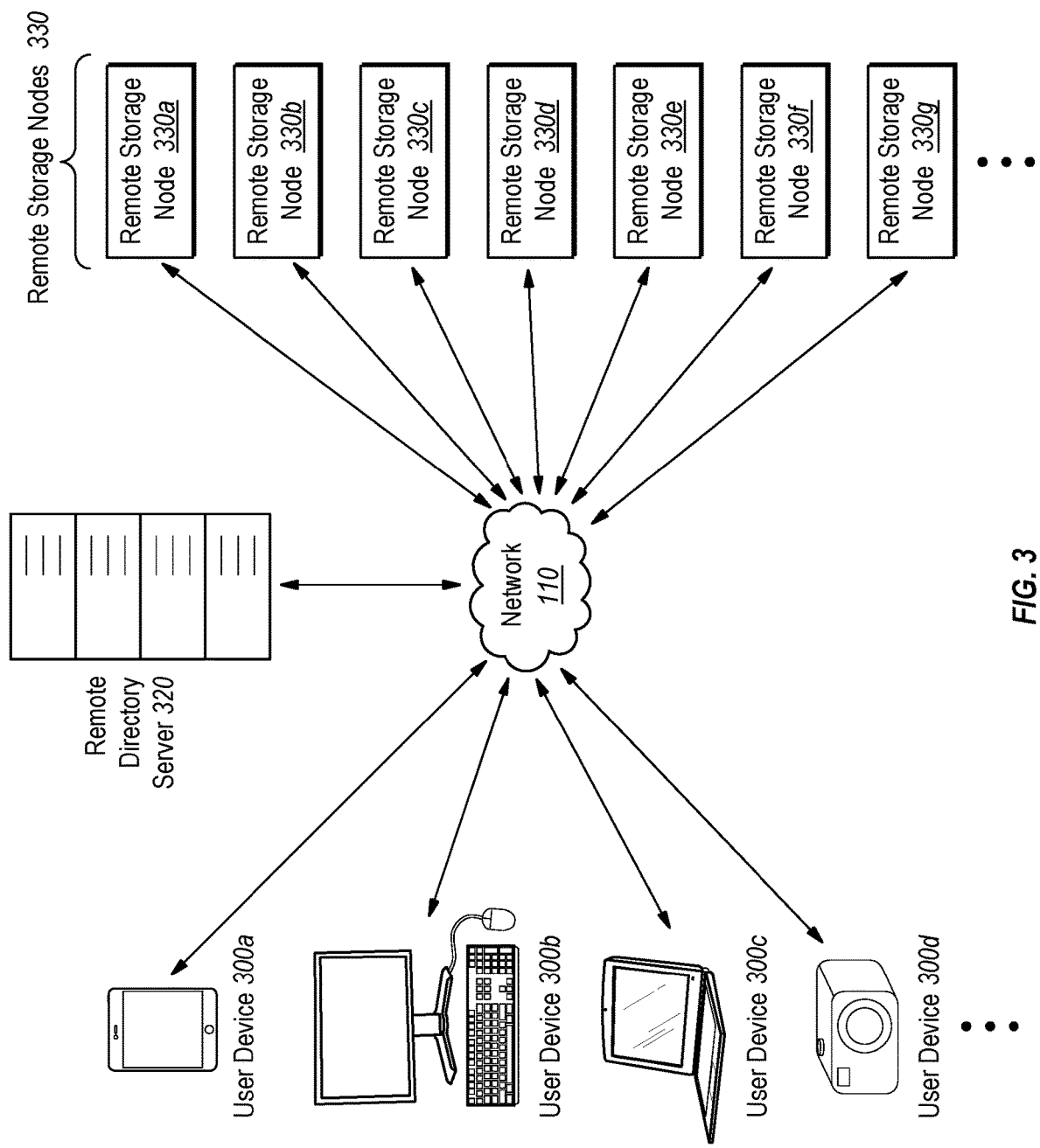
FIG. 3 illustrates a schematic of yet another embodiment of another system for optimizing bandwidth usage within a cloud storage system.

In various additional or alternative embodiments, further security measures can be taken to protect user data. For example, FIG. 3 illustrates a schematic of yet another embodiment of another system for optimizing bandwidth usage within a cloud storage system. In particular, FIG. 3 depicts multiple different user devices 300(*a-d*), each associated with a different user, accessing remote storage nodes 330(*a-g*) through the network 110. The various user devices can comprise a mobile phone 300*a*, a desktop computer 300*b*, a laptop computer 300*c*, and various purpose built devices, such a network-connected digital camera 300*d*.

In at least one embodiment, the various user devices 300(*a-d*) are each capable of storing and accessing data stored within the remote storage nodes 330. As explained above, in at least one embodiment, the respective user devices 300(*a-d*) secure the data they store and access by utilizing locally generated encryption. In such a case, other users are unable to decrypt the data stored by others.

In at least one embodiment, as a form of additional or alternative security, each user's data is at least partially physically segregated from other users' data. For example, in a simple case, a remote directory server 320 may provide each user device 300(*a-d*) with addresses to different respective remote storage nodes 330. For example, the remote directory server 320 may provide an address to remote storage node 330*a* only to user device 300*a*. Similarly, the remote directory server 320 may provide an addresses to remote storage nodes 330*b* and 300*c* only to user device 300*b*. In such an implementation, no user's data is mingled with the data of another user.

In an additional or alternative embodiment, data is stored among the remote storage nodes 330 using data striping and error-correction coding. As such, a single digital file from user device 300*a* may be represented by different data blocks stored within remote storage nodes 330*a*, 330*c*, 330*d*, and 330*e*. Additionally, using the error-correction coding, user device 300*a* may be able to rebuild the entire digital file with data blocks from only remote storage nodes 330*a*, 330*d*, and 330*e*. In other words, the error-correction coding may allow an entire file to be recovered when only three-fourths of the original data blocks are accessible. One will understand that the example of requiring three-fourths of the original data blocks is merely exemplary and that alternative designs can be used to increase or decrease the ratio of data blocks needed to recover the original file.

As used herein, a minimum recovery threshold is the number of respective remote storage nodes 330 that must be accessible in order to recover an entire digital file. For example, user device 300*a* may store data blocks from a single digital file to forty different remote storage nodes 330. However, user device 300*a* may be able to recover an entire digital file if it can retrieve data from only twenty of the forty remote storage nodes 330. As such, in this case the minimum recovery threshold is twenty remote storage nodes.

In at least one embodiment, to increase the security of data stored within the remote storage nodes, the remote directory server 320 physically segregates user data by requiring user devices 300(*a-d*) to have fewer than the minimum recovery threshold of overlapping remote storage nodes 330. For example, user devices 300*a* and 300*b* may each be configured to store data blocks to four different remote storage nodes 330. Additionally, due to the error-correction coding, both user devices 300*a* and 300*b* may be capable of recovering an entire digital file using data received from only three of the four respective remote storage nodes 330.

For example, in at least one embodiment, user device 300*a* requests addresses to remote storage nodes 330 for the purposes of storing a first digital file. In response to the request, the remote directory server 320 provides user device 300*a* with addresses to remote storage nodes 330*a*, 330*b*, 330*c*, and 330*d*. User device 300*a* then stores data blocks associated with the first digital file into each of the remote storage nodes 330*a*, 330*b*, 330*c*, and 330*d*. As stated above, user device 300*a* is capable of recovering the digital using any three of the four remote storage nodes.

User device 300*b* then also requests addresses to remote storage nodes 330 for the purposes of storing a second digital file. In this case, however, to enforce the above referenced security feature, the remote directory server 320 will require that fewer than three remote storage nodes 330 overlap between user device 300*a* and user device 300*b*. For instance, the remote directory server 320 may send user device 300*b* addresses to remote storage nodes 330*a*, 330*b*, 330*e*, and 330*f*. User device 300*b* then stores data blocks associated with the second digital file into each of the remote storage nodes 330*a*, 330*b*, 330*e*, and 330*f*. As such, even if user device 300*b* incorrectly gains access to the entirety of data stored at remote storage nodes 330*a* and 330*b*, it will be incapable of recovering the first digital file because it has access to less than the minimum recovery threshold of remote storage nodes 330 required to recover the first digital file.

Accordingly, disclosed embodiments include methods and systems for efficiently storing data with a distributed cloud network. In particular, disclosed embodiments increase bandwidth efficiency by removing bottle-necks associated with having data stored in a single server farm. Additionally, disclosed embodiments increase the recoverability of data by distributing the data between multiple independent storage nodes. As such, power outages, or other technical problems, at a server farm do not impact the ability of a user to recover the data. Further, multiple data nodes can be unavailable and the data can still be recovered.

Additionally, in at least one embodiment, disclosed embodiments increase bandwidth efficiency by dynamically selecting remote storage nodes to retrieve data from. For example, user device 300*a* may request a digital file that is stored at remote storage nodes 330*a*, 330*b*, 330*c*, and 330*d*. Upon connecting to each remote storage node 330*a*, 330*b*, 330*c*, and 330*d*, the user device 300*a* may determine that the connection to storage node 330*d* is substantially slower than the connection to the other remote storage nodes 330*a*, 330*b*, 330*c*. In such a case, instead of waiting for the data blocks to download from remote storage node 330*d*, the user device 300*a* may simply drop the connection to remote storage node 330*d* and recover the digital file using error-correction coding and the data stored in remote storage nodes 330*a*, 330*b*, and 330*c*. Accordingly, in at least one embodiment, a user device 300*a* dynamically determines whether it is faster to download data blocks from a collection of remote storage nodes 330 or to download only a portion of the data blocks from a subset of the remote storage nodes 330 and recover the entire digital file using error-correction coding.

One will appreciate that embodiments disclosed herein can also be described in terms of flowcharts comprising one or more acts for accomplishing a particular result. For example, FIGS. 4 and 5 and the corresponding text describe acts in various methods and systems for optimizing bandwidth usage within a cloud storage system. The acts of FIGS. 4 and 5 are described below.

Figure 4:
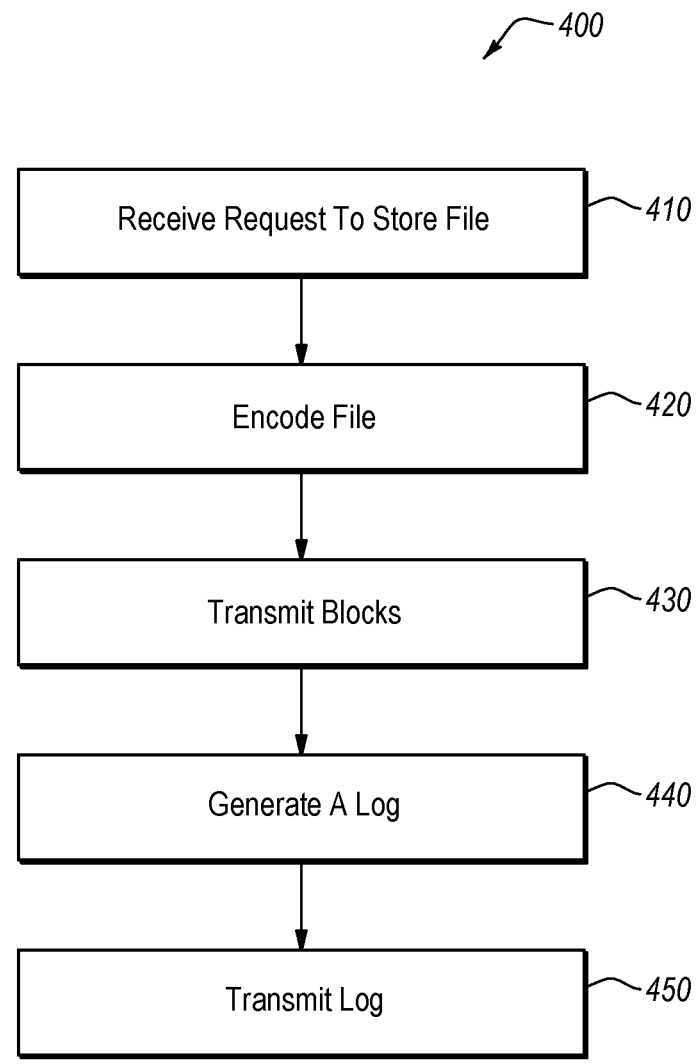
FIG. 4 illustrates a flow chart of an embodiment of a method for optimizing bandwidth usage within a cloud storage system.
Figure 5:
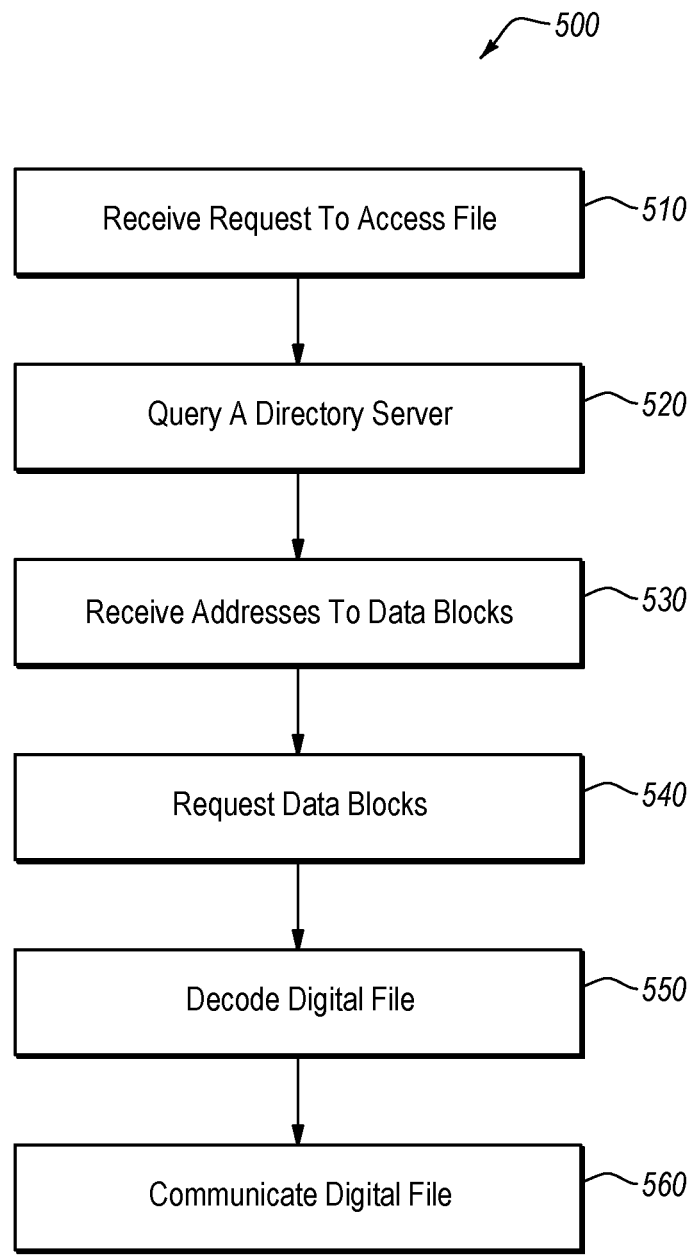
FIG. 5 illustrates a flow chart of an embodiment of another method for optimizing bandwidth usage within a cloud storage system.

For example, FIG. 4 illustrates that a flow chart of an embodiment of a method 400 for optimizing bandwidth usage within a cloud storage system can comprise act 410 of receiving a request to store a file. Act 410 includes receiving a request, through an application program interface (API), to store a digital file. For example, as depicted and described with respect to FIG. 2, a processor 202 receives a request, through a storage API 204, to store a digital file. In at least one embodiment, the request is generated by a software application 206.

Additionally, FIG. 4 illustrates that the method 400 comprises an act 420 of encoding a file. Act 420 includes encoding the digital file into a set of multiple distinct blocks of data. The multiple distinct blocks of data each comprise a retrievable portion of the digital file and the set of multiple distinct blocks of data comprises parity information. For example, as depicted and described with respect to FIG. 2, a processor 202 encodes a digital file using a Reed-Solomon algorithm.

FIG. 4 also illustrates that the method 400 comprises an act 430 of transmitting blocks. Act 430 includes transmitting the set of multiple distinct blocks of data to multiple remote storage nodes. The multiple distinct blocks of data are divided among at least a portion of the remote storage nodes. For example, as depicted and described with respect to FIG. 3, user device 300a transmit data blocks to remote storage nodes 330a, 330b, 330c, 330d.

Further, FIG. 4 illustrates that the method 400 comprises an act 440 of generating a log. Act 440 includes generating a log that comprises identification information associated with the digital file and an address for each respective block of data within each respect remote storage node. For example, as depicted and described with respect to FIG. 2, the processor 202 generates a log of identification information and addresses for each data block of the encoded digital file. The log comprises an address table to access each block associated with the digital file.

Further still, FIG. 4 illustrates that the method 400 comprises an act 450 of transmitting the log. Act 450 includes transmitting the log to a remote directory server. The remote directory server comprises multiple different logs that map multiple different digital files to the remote storage nodes. For example, as depicted and described with respect to FIGS. 2 and 3, the remote directory server 120 comprises various logs 222 that map digital files to respective remote storage nodes. The logs are accessible by different users in order to recover the storage digital files.

FIG. 5 illustrates a flow chart of an embodiment of another method 500 for optimizing bandwidth usage within a cloud storage system. In particular, FIG. 5 illustrates that the method 500 comprises an act 510 of receiving a request to access a file. Act 510 includes receiving a request, through an application program interface (API), to access a digital file. For example, as depicted and described with respect to FIG. 2, a processor 202 receives a request, through a storage API 204, to access a digital file. In at least one embodiment, the request is generated by a software application 206.

FIG. 5 illustrates that the method also comprises an act 520 of querying a directory server 520. Act 520 includes querying a remote directory server for the digital file. For example, as depicted and described with respect to FIG. 2, a processor 202 queries remote directory server 120 regarding the desired digital file.

Additionally, FIG. 5 illustrates that the method comprises an act 530 of receiving addresses to data blocks. Act 530 includes receiving, from the remote directory server, addresses to data blocks stored within multiple remote storage nodes. For example, as depicted and described with respect to FIG. 2, the remote directory server 120 accesses its logs 222 and sends the mobile computing device 100 addresses to the data blocks.

FIG. 5 also illustrates that the method comprises an act 540 of requesting data blocks. Act 540 includes requesting, from at least a portion of the remote storage nodes, at least a portion of the addressed data blocks. For example, as depicted and described with respect to FIGS. 2 and 3, a mobile computing device 100 requests the addressed data blocks from the respective remote storage nodes 130(a-d).

Further, FIG. 5 illustrates that the method comprises an act 550 of decoding a digital file. Act 550 includes decoding the digital file from the portion of the addressed data blocks. Decoding the digital file comprises rebuilding at least a portion of the digital file using parity information associated with the portion of the addressed data blocks. For example, as depicted and described with respect to FIG. 2, the mobile computing device 100 may only be able to access data stored on a portion of the remote storage nodes 130(a-d). In such a case, the processor 202 decodes the data blocks and uses error-correction coding, and associated parity data, to recover the missing portions of the digital file.

Further still, FIG. 5 illustrates that the method comprises an act 560 of communicating the digital file. Act 560 includes communicating the decoded digital file to a requester. For example, as depicted and described with respect to FIG. 2, the processor 202 provides the recovered digital file to the requesting software application 206.

Further, the methods may be practiced by a computer system including one or more processors and computer-readable media such as computer memory. In particular, the computer memory may store computer-executable instructions that when executed by one or more processors cause various functions to be performed, such as the acts recited in the embodiments.

Embodiments of the present invention may comprise or utilize a special purpose or general-purpose computer including computer hardware, as discussed in greater detail below. Embodiments within the scope of the present invention also include physical and other computer-readable media for carrying or storing computer-executable instructions and/or data structures. Such computer-readable media can be any available media that can be accessed by a general-purpose or special purpose computer system. Computer-readable media that store computer-executable instructions are physical storage media. Computer-readable media that carry computer-executable instructions are transmission media. Thus, by way of example, and not limitation, embodiments of the invention can comprise at least two distinctly different kinds of computer-readable media: physical computer-readable storage media and transmission computer-readable media.

Physical computer-readable storage media includes RAM, ROM, EEPROM, CD-ROM or other optical disk storage (such as CDs, DVDs, etc.), magnetic disk storage or other magnetic storage devices, or any other medium which can be used to store desired program code means in the form of computer-executable instructions or data structures and which can be accessed by a general-purpose or special purpose computer.

A "network" is defined as one or more data links that enable the transport of electronic data between computer systems and/or modules and/or other electronic devices. When information is transferred or provided over a network or another communications connection (either hardwired, wireless, or a combination of hardwired or wireless) to a computer, the computer properly views the connection as a transmission medium. Transmissions media can include a network and/or data links which can be used to carry a desired program code means in the form of computer-executable instructions or data structures and which can be accessed by a general-purpose or special purpose computer. Combinations of the above are also included within the scope of computer-readable media.

Further, upon reaching various computer system components, program code means in the form of computer-executable instructions or data structures can be transferred automatically from transmission computer-readable media to physical computer-readable storage media (or vice versa). For example, computer-executable instructions or data structures received over a network or data link can be buffered in RAM within a network interface module (e.g., a "NIC"), and then eventually transferred to computer system RAM and/or to less volatile computer-readable physical storage media at a computer system. Thus, computer-readable physical storage media can be included in computer system components that also (or even primarily) utilize transmission media.

Computer-executable instructions comprise, for example, instructions and data which cause a general-purpose computer, special purpose computer, or special purpose processing device to perform a certain function or group of functions. The computer-executable instructions may be, for example, binaries, intermediate format instructions such as assembly language, or even source code. Although the subject matter has been described in language specific to structural features and/or methodological acts, it is to be understood that the subject matter defined in the appended claims is not necessarily limited to the described features or acts described above. Rather, the described features and acts are disclosed as example forms of implementing the claims.

Those skilled in the art will appreciate that the invention may be practiced in network computing environments with many types of computer system configurations, including, personal computers, desktop computers, laptop computers, message processors, hand-held devices, multi-processor systems, microprocessor-based or programmable consumer electronics, network PCs, minicomputers, mainframe computers, mobile telephones, PDAs, pagers, routers, switches, and the like. The invention may also be practiced in distributed system environments where local and remote computer systems, which are linked (either by hardwired data links, wireless data links, or by a combination of hardwired and wireless data links) through a network, both perform tasks. In a distributed system environment, program modules may be located in both local and remote memory storage devices.

Alternatively, or in addition, the functionality described herein can be performed, at least in part, by one or more hardware logic components. For example, and without limitation, illustrative types of hardware logic components that can be used include Field-programmable Gate Arrays (FPGAs), Program-specific Integrated Circuits (ASICs), Program-specific Standard Products (ASSPs), System-on-a-chip systems (SOCs), Complex Programmable Logic Devices (CPLDs), etc.

The present invention may be embodied in other specific forms without departing from its spirit or characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A computer system for optimizing bandwidth usage within a cloud storage system, comprising:
one or more processors; and
one or more non-transitory computer-readable media having stored thereon executable instructions that when executed by the one or more processors configure the computer system to perform at least the following:
receive a request, through an application program interface (API), to store a digital file;
encode the digital file into a set of multiple distinct blocks of data, wherein the multiple distinct blocks of data each comprise a retrievable portion of the digital file and the set of multiple distinct blocks of data comprises parity information;
transmit the set of multiple distinct blocks of data to multiple remote storage nodes, wherein the multiple distinct blocks of data are divided among at least a portion of the remote storage nodes;
generate a log that comprises identification information associated with the digital file and an address for each respective block of data within each respective remote storage node; and
transmit the log to a remote directory server, wherein:
the remote directory server comprises multiple different logs that map multiple different digital files to the remote storage nodes, and
the remote directory server tracks outdated blocks of data that are stored at one or more remote storage nodes selected from the multiple storage nodes, wherein the outdated blocks are excluded from a request for a file that is associated with the outdated blocks.

2. The computer system as recited in claim 1, wherein the digital file is encoded using a Reed-Solomon algorithm.

3. The computer system as recited in claim 1, wherein the executable instructions include instructions that are executable to configure the computer system to:
before encoding the digital file, encrypt the digital file, and
store an associated encryption key locally.

4. The computer system as recited in claim 1, wherein the executable instructions include instructions that are executable to configure the computer system to:
before transmitting the set of multiple distinct blocks of data to multiple remote storage nodes, request from the remote directory server a set of nodes available for storage and internet protocol addresses associated with each available remote storage node, and
wherein the set of nodes available for storage comprises the multiple remote storage nodes.

5. The computer system as recited in claim 4, wherein the remote directory server selects a particular subset of remote storage nodes from a larger set of remote storage nodes based upon a predetermined segregation of a first user's data from a second user's data.

6. The computer system as recited in claim 4, wherein the executable instructions include instructions that are executable to configure the computer system to:
- communicate an authentication credential to an account management server, and
- after being authenticated at the account management server, receiving a credential necessary for accessing the remote directory server.

7. The computer system as recited in claim 1, wherein the digital file is encoded by a processor within a mobile computing device.

8. The computer system as recited in claim 7, wherein at least a portion of the remote storage nodes comprise home-based computing devices that are each disposed within different respective houses.

9. A computer-based method for optimizing data integrity within a cloud storage system, comprising:
- receiving a request, through an application program interface (API), to store a digital file;
- loading the digital file into local memory space;
- encoding the digital file into a set of multiple distinct blocks of data, wherein the multiple distinct blocks of data each comprise a retrievable portion of the digital file and the set of multiple distinct blocks of data comprises parity information;
- transmitting the set of multiple distinct blocks of data to multiple remote storage nodes, wherein:
  - the multiple distinct blocks of data are divided among at least a portion of the remote storage nodes, and
  - the multiple distinct blocks of data are divided among a particular subset of remote storage nodes selected from a larger set of remote storage nodes based upon a predetermined segregation of a first user's data from a second user's data, wherein the predetermined segregation is such that the particular subset of remote storage nodes, which is associated with the first user's data, has fewer than a minimum recovery threshold of overlapping remote storage nodes, as defined by the parity information, with another subset of remote storage nodes that are associated with the second tier's data;
- generating a log that comprises identification information associated with the digital file and an address for each respective block of data within each respective remote storage node; and
- transmitting the log to a remote directory server, wherein the remote directory server comprises multiple different logs that map multiple different digital files to the remote storage nodes.

* * * * *